(12) United States Patent
Masuoka et al.

(10) Patent No.: US 9,853,113 B2
(45) Date of Patent: *Dec. 26, 2017

(54) SEMICONDUCTOR DEVICE

(71) Applicant: UNISANTIS ELECTRONICS SINGAPORE PTE. LTD., Singapore (SG)

(72) Inventors: Fujio Masuoka, Tokyo (JP); Nozomu Harada, Tokyo (JP); Hiroki Nakamura, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 318 days.

This patent is subject to a terminal disclaimer.

(21) Appl. No.: 14/602,727

(22) Filed: Jan. 22, 2015

(65) Prior Publication Data

US 2015/0145050 A1    May 28, 2015

Related U.S. Application Data

(62) Division of application No. 13/893,560, filed on May 14, 2013, now Pat. No. 8,975,705.

(Continued)

(51) Int. Cl.
*H01L 29/423* (2006.01)
*H01L 27/092* (2006.01)
(Continued)

(52) U.S. Cl.
CPC ............ *H01L 29/42392* (2013.01); *H01L 21/823828* (2013.01); *H01L 21/823885* (2013.01); *H01L 27/092* (2013.01); *H01L 27/1104* (2013.01); *H01L 27/1211* (2013.01); *H01L 29/0657* (2013.01); *H01L 29/0865* (2013.01);
(Continued)

(58) Field of Classification Search
CPC .......... H01L 29/7827; H01L 29/42392; H01L 29/0865; H01L 21/823828; H01L 21/823885; H01L 27/1211; H01L 29/0657
See application file for complete search history.

(56) References Cited

U.S. PATENT DOCUMENTS 5,909,618 A    6/1999  Forbes et al.
6,477,080 B2  11/2002  Noble
(Continued)

FOREIGN PATENT DOCUMENTS

JP    H0271556 A    3/1990
JP    02188966 A    7/1990
(Continued)

*Primary Examiner* — Amar Movva
(74) *Attorney, Agent, or Firm* — Brinks Gilson & Lione

(57) ABSTRACT

A semiconductor device includes a first planar semiconductor (e.g., silicon) layer, first and second pillar-shaped semiconductor (e.g., silicon) layers, a first gate insulating film, a first gate electrode, a second gate insulating film, a second gate electrode, a first gate line connected to the first and second gate electrodes, a first n-type diffusion layer, a second n-type diffusion layer, a first p-type diffusion layer, and a second p-type diffusion layer. A center line extending along the first gate line is offset by a first predetermined amount from a line connecting a center of the first pillar-shaped semiconductor layer and a center of the second pillar-shaped semiconductor layer.

4 Claims, 3 Drawing Sheets

Related U.S. Application Data

(60) Provisional application No. 61/649,442, filed on May 21, 2012.

(51) Int. Cl.

| | | |
|---|---|---|
| *H01L 21/8238* | (2006.01) | |
| *H01L 27/11* | (2006.01) | |
| *H01L 29/78* | (2006.01) | |
| *H01L 27/12* | (2006.01) | |
| *H01L 29/06* | (2006.01) | |
| *H01L 29/08* | (2006.01) | |
| *H01L 29/16* | (2006.01) | |
| *H01L 27/02* | (2006.01) | |

(52) U.S. Cl.
CPC .......... *H01L 29/0882* (2013.01); *H01L 29/16* (2013.01); *H01L 29/7827* (2013.01); *H01L 27/0207* (2013.01)

(56) References Cited

U.S. PATENT DOCUMENTS

| | | | | |
|---|---|---|---|---|
| 9,093,305 B2* | 7/2015 | Masuoka | ............ | H01L 27/092 |
| 2006/0118846 A1* | 6/2006 | Bissey | ................ | H01L 29/7827 |
| | | | | 257/296 |
| 2007/0075359 A1 | 4/2007 | Yoon et al. | | |
| 2007/0114576 A1 | 5/2007 | Forbes | | |
| 2010/0203714 A1* | 8/2010 | Masuoka | ................ | H01L 21/84 |
| | | | | 438/586 |
| 2010/0219466 A1 | 9/2010 | Sung et al. | | |
| 2010/0219483 A1* | 9/2010 | Masuoka | .............. | H01L 21/845 |
| | | | | 257/369 |
| 2011/0062515 A1 | 3/2011 | Masuoka et al. | | |
| 2011/0062521 A1 | 3/2011 | Masuoka et al. | | |
| 2011/0241122 A1 | 10/2011 | Masuoka et al. | | |
| 2013/0307083 A1 | 11/2013 | Masuoka et al. | | |

FOREIGN PATENT DOCUMENTS

| | | |
|---|---|---|
| JP | 03145761 A | 6/1991 |
| JP | H03225873 A | 10/1991 |
| JP | 2008205168 A | 9/2008 |
| JP | 2011029469 A | 2/2011 |
| JP | 2011066105 A | 3/2011 |
| JP | 2011086900 A | 4/2011 |
| WO | 2009095998 A1 | 8/2009 |

* cited by examiner

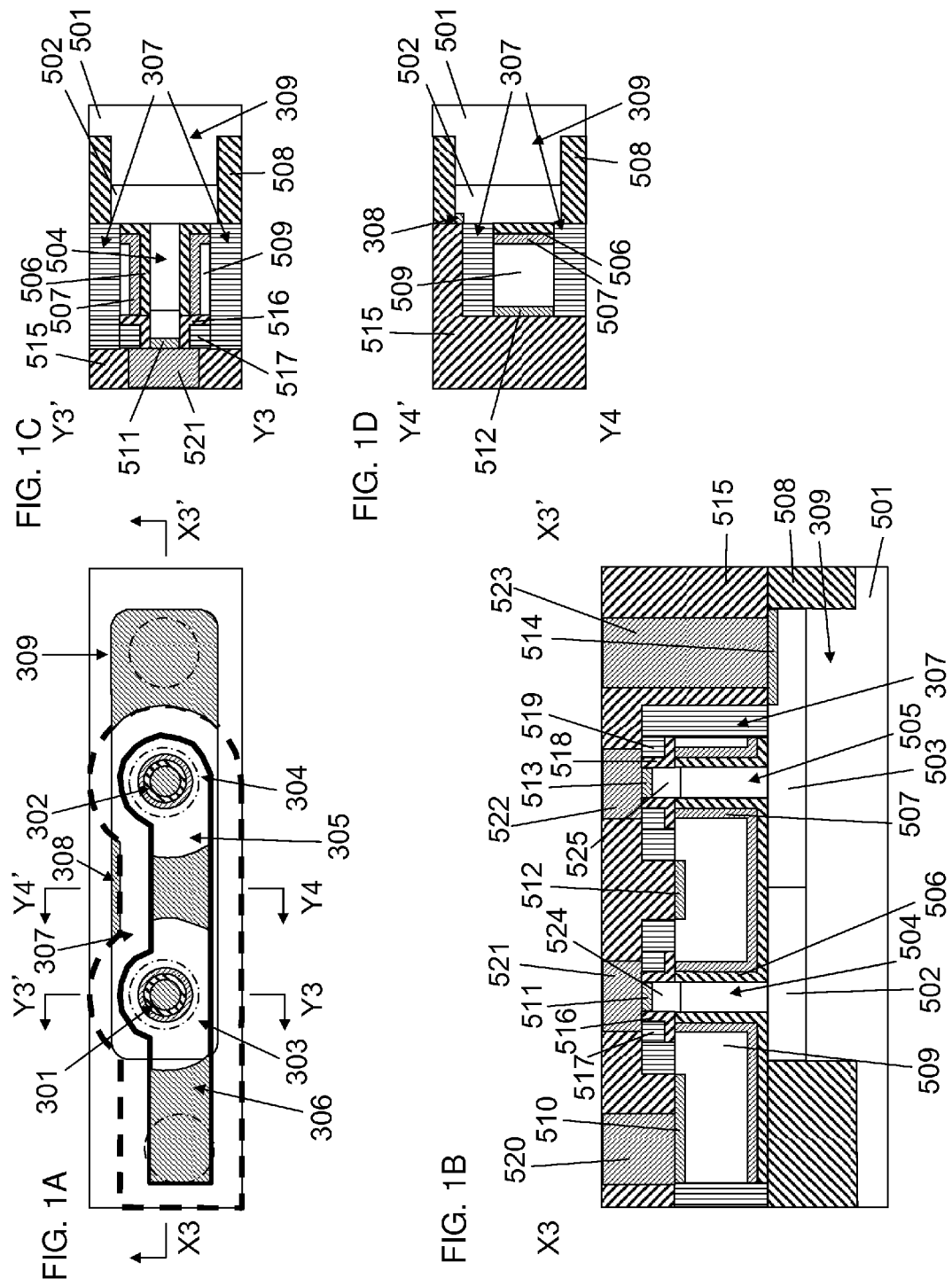

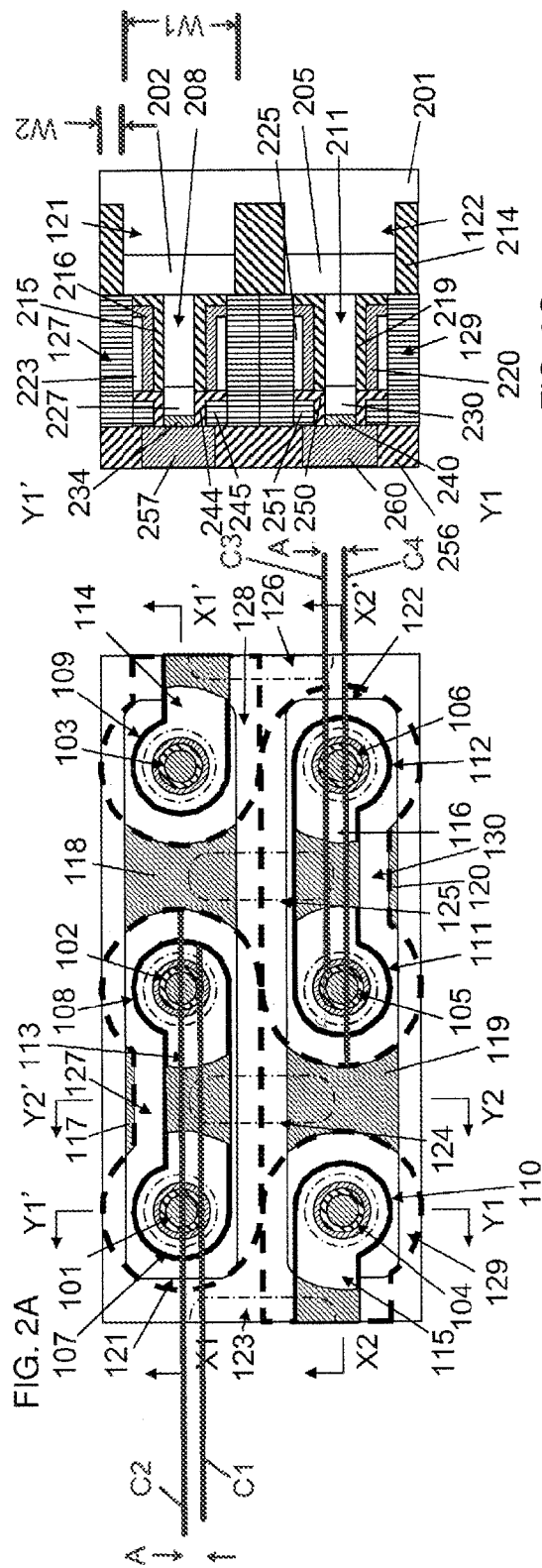
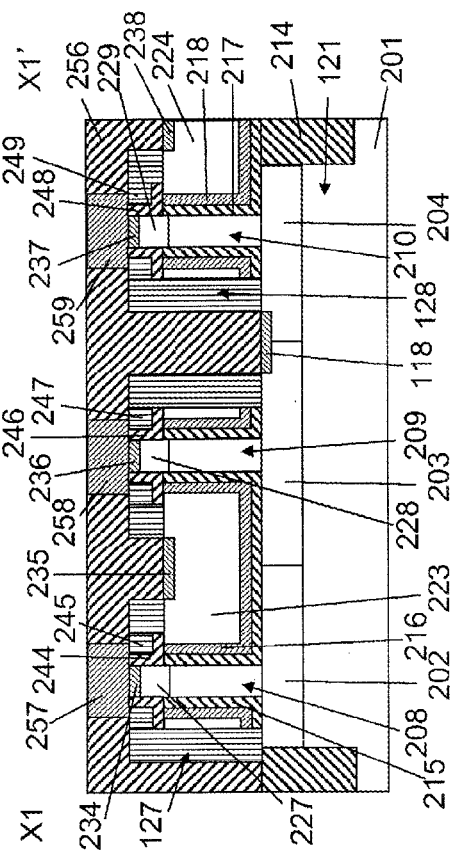
FIG. 2A
FIG. 2B
FIG. 2C

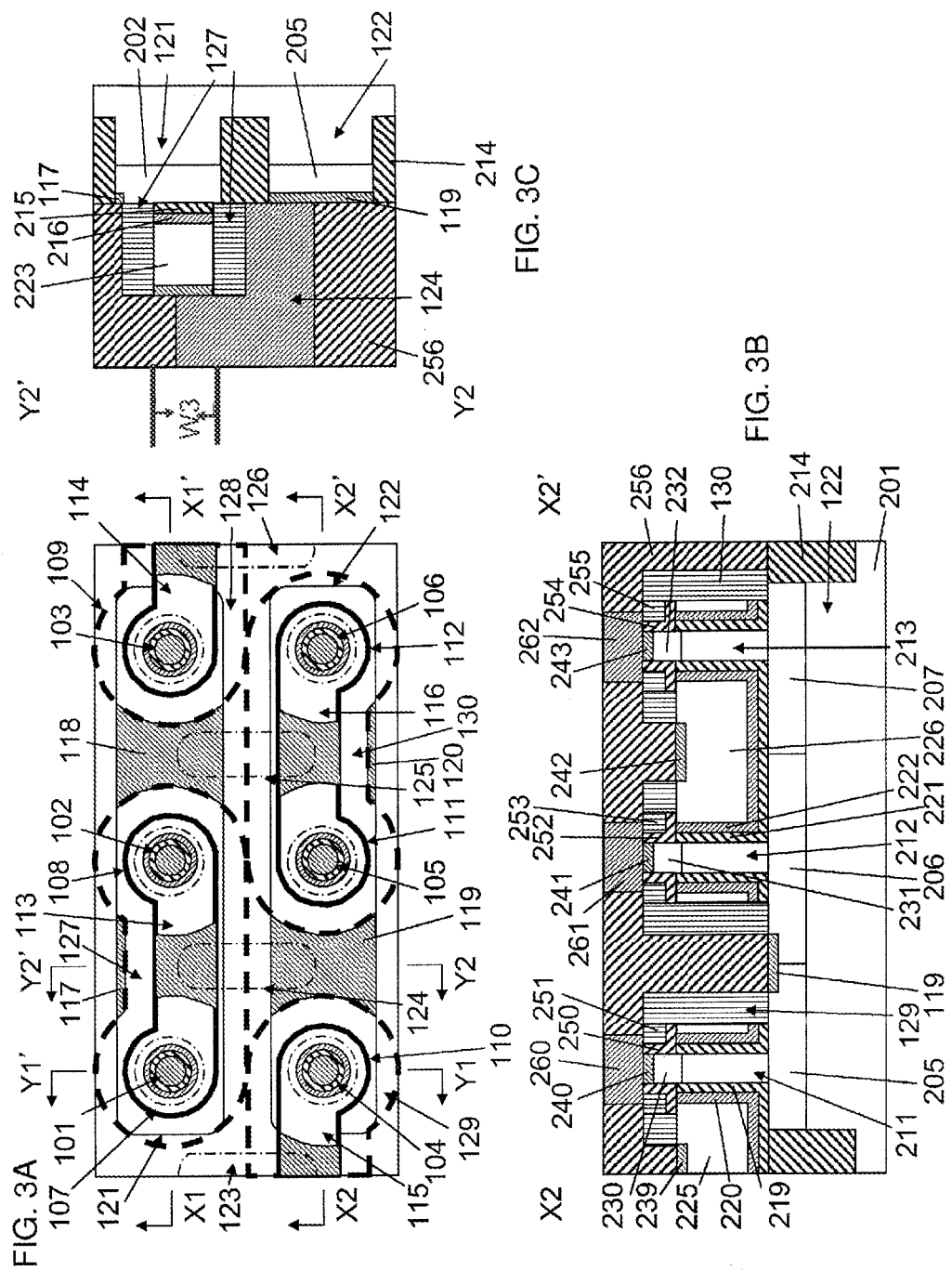

SEMICONDUCTOR DEVICE

CROSS-REFERENCE TO RELATED APPLICATION

This application is a divisional of copending patent application Ser. No. 13/893,560, filed May 14, 2013; which claimed the benefit, under 35 U.S.C. §119(e), of provisional patent application No. 61/649,442 filed May 21, 2012; the prior applications are herewith incorporated by reference in their entirety.

BACKGROUND OF THE INVENTION

Field of the Invention

The present invention relates to a semiconductor device.

Semiconductor integrated circuits, particularly integrated circuits using MOS transistors, are increasing in integration. With increases in integration, MOS transistors become finer up to a nano-level. Such finer MOS transistors have difficulty in suppressing leak currents and difficulty in decreasing areas occupied by circuits in view of the demand for securing necessary amounts of currents. In order to resolve the problem, there are proposed surrounding gate transistors (referred to as "SGT" hereinafter) having a structure in which a source, gate, and drain are disposed perpendicularly to a substrate, and a gate electrode surrounds a pillar-shaped semiconductor layer (for example, refer to Japanese Unexamined Patent Application Publication Nos. 2-71556, 2-188966, and 3-145761).

Also, there is proposed a structure in which a CMOS inverter is formed by using the SGT so that n-type SGT and p-type SGT are disposed on a line and diffusion layers positioned at the bottom portions of silicon pillars are used as the output of the inverter (refer to, for example, Japanese Unexamined Patent Application Publication No. 2008-205168). In this structure, a connection region of ohmic junction with p- and n-regions containing impurities is formed in a surface of an element formation region, and the connection region is electrically connected to vias for output signals outside the n-type SGT and p-type SGT.

This technique cannot establish a method for forming the connection region because the width of gate line is larger than the width of the element formation region.

In this technique, forming a connection region with silicide requires a protective film to be used for silicidization and a sidewall to be formed around the gate line in order to prevent short circuiting.

Therefore, when silicide is formed on portions of an element formation region around both opposing sides of gate line, it is necessary that the width of the element formation region is wider than the total of the width of the gate line and a length of twice the width of the side wall. In this case, the area occupied by the element formation region is increased.

Further, SRAM (Static Random Access Memory) using six SGTs is proposed (refer to, for example, International Publication No. 2009/095998). In this literature, the width of an element formation region is wider than the total of the width of gate line and a length of twice the width of a sidewall, and silicide is formed on portions of the element formation region which are present around both opposing sides of the gate line. In this case, the area occupied by the element formation region is increased.

SUMMARY OF THE INVENTION

An object of the present invention is to provide a semiconductor device having a small area occupied by an element formation region and using CMOS SGT.

A semiconductor device in a first aspect of the present invention includes:
a first planar silicon layer formed on a substrate;
first and second pillar-shaped silicon layers formed on the first planar silicon layer;
a first gate insulating film formed around the first pillar-shaped silicon layer;
a first gate electrode formed around the first gate insulating film;
a second gate insulating film formed around the second pillar-shaped silicon layer;
a second gate electrode formed around the second gate insulating film;
a first gate line connected to the first and second gate electrodes;
a first second-conductivity-type diffusion layer formed in an upper portion of the first pillar-shaped silicon layer;
a second second-conductivity-type diffusion layer formed over a lower portion of the first pillar-shaped silicon layer and an upper portion of the planar silicon layer;
a first first-conductivity-type diffusion layer formed in an upper portion of the second pillar-shaped silicon layer; and
a second first-conductivity-type diffusion layer formed over a lower portion of the second pillar-shaped silicon layer and an upper portion of the planar silicon layer,
wherein a center line extending along the first gate line is offset by a first predetermined amount from a line connecting a center of the first pillar-shaped silicon layer and a center of the second pillar-shaped silicon layer.

The semiconductor device further includes:
a first insulating film sidewall formed on the sidewall of the first gate line; and
a silicide formed over the second second-conductivity-type diffusion layer and the second first-conductivity-type diffusion layer,
wherein the first predetermined amount is preferably larger than a value obtained by subtracting a length of half the width of the first planar silicon layer from the total of the width of the first insulating film sidewall and a length of half the width of the first gate line.

The first predetermined amount is preferably larger than a value obtained by subtracting the total of the width of the first insulating film sidewall and a length of half the width of the first gate line from the width of the first planar silicon layer.

The semiconductor device preferably further includes:
a second insulating film sidewall formed over an upper sidewall of the first pillar-shaped silicon layer and an upper portion of the first gate electrode;
a third insulating film sidewall formed over an upper sidewall of the second pillar-shaped silicon layer and an upper portion of the second gate electrode;
a first insulating film sidewall formed over the second and third insulating film sidewalls, the first and second gate electrodes, and a sidewall of the first gate line; and
a silicide formed over the first second-conductivity-type diffusion layer and the first first-conductivity-type diffusion layer.

With the above and other objects in view there is also provided, in accordance with a second embodiment of the invention, a semiconductor which comprises the following elements:
an 11th (first) planar silicon layer formed in the first row of coordinates of rows and columns arranged on a substrate so as to extend in the row direction;

an 11th (first) pillar-shaped silicon layer formed on the 11th (first) planar silicon layer to be disposed in the first row and the first column of the coordinates;

an 11th (first) gate insulating film formed around the 11th (first) pillar-shaped silicon layer;

an 11th (first) gate electrode formed around the 11th (first) gate insulating film;

an 11th (first) second-conductivity-type diffusion layer formed in an upper portion of the 11th (first) pillar-shaped silicon layer;

a 12th (second) second-conductivity-type diffusion layer formed over a lower portion of the 11th (first) pillar-shaped silicon layer and an upper portion of the 11th (first) planar silicon layer;

a 12th (second) pillar-shaped silicon layer formed on the 11th (first) planar silicon layer to be disposed in the first row and the second column of the coordinates;

a 12th (second) gate insulating film formed around the 12th (second) pillar-shaped silicon layer;

a 12th (second) gate electrode formed around the 12th (second) gate insulating film;

an 11th (first) first-conductivity-type diffusion layer formed in an upper portion of the 12th (second) pillar-shaped silicon layer;

a 12th (second) first-conductivity-type diffusion layer formed over a lower portion of the 12th (second) pillar-shaped silicon layer and an upper portion of the 11th (first) planar silicon layer;

a 13th (third) pillar-shaped silicon layer formed on the 11th (first) planar silicon layer to be disposed in the first row and the third column of the coordinates;

a 13th (third) gate insulating film formed around the 13th (third) pillar-shaped silicon layer;

a 13th (third) gate electrode formed around the 13th (third) gate insulating film;

a 13th (third) second-conductivity-type diffusion layer formed in an upper portion of the 13th (third) pillar-shaped silicon layer;

a 14th (fourth) (fourth) second-conductivity-type diffusion layer formed over a lower portion of the 13th (third) pillar-shaped silicon layer and an upper portion of the 11th (first) planar silicon layer;

an 11th (first) gate line connected to the 11th (first) and 12th (second) gate electrodes;

a 21st (fifth) planar silicon layer formed in the second row of the coordinates arranged on the substrate;

a 21st (fifth) pillar-shaped silicon layer formed on the 21st (fifth) planar silicon layer to be disposed in the second row and the first column of the coordinates;

a 21st (fifth) gate insulating film formed around the 21st (fifth) pillar-shaped silicon layer;

a 21st (fifth) gate electrode formed around the 21st (fifth) gate insulating film;

a 21st (fifth) second-conductivity-type diffusion layer formed in an upper portion of the 21st (fifth) pillar-shaped silicon layer;

a 22nd (sixth) second-conductivity-type diffusion layer formed over a lower portion of the 21st (fifth) pillar-shaped silicon layer and an upper portion of the 21st (fifth) planar silicon layer;

a 22nd (sixth) pillar-shaped silicon layer formed on the 21st (fifth) planar silicon layer to be disposed in the second row and the second column of the coordinates;

a 22nd (sixth) gate insulating film formed around the 22nd (sixth) pillar-shaped silicon layer;

a 22nd (sixth) gate electrode formed around the 22nd (sixth) gate insulating film;

a 21st (fifth) first-conductivity-type diffusion layer formed in an upper portion of the 22nd (sixth) pillar-shaped silicon layer;

a 22nd (sixth) first-conductivity-type diffusion layer formed over a lower portion of the 22nd (sixth) pillar-shaped silicon layer and an upper portion of the 21st (fifth) planar silicon layer;

a 23rd (seventh) (seventh) pillar-shaped silicon layer formed on the 21st (fifth) planar silicon layer to be disposed in the second row and the third column of the coordinates;

a 23rd (seventh) (seventh) gate insulating film formed around the 23rd (seventh) pillar-shaped silicon layer;

a 23rd (seventh) gate electrode formed around the 23rd (seventh) gate insulating film;

a 23rd (seventh) second-conductivity-type diffusion layer formed in an upper portion of the 23rd (seventh) pillar-shaped silicon layer;

a 24th (eighth) second-conductivity-type diffusion layer formed over a lower portion of the 23rd (seventh) pillar-shaped silicon layer and an upper portion of the 21st (fifth) planar silicon layer; and a 21st (fifth) gate line connected to the 22nd (sixth) and 23rd (seventh) gate electrodes, wherein a center line extending along the 11th (first) gate line is offset to the second row of the coordinates by an 11th (first) predetermined amount from a line connecting a center of the 11th (first) pillar-shaped silicon layer and a center of the 12th (second) pillar-shaped silicon layer; and a center line extending along the 21st (fifth) gate line is offset to the first row of the coordinates by the 11th (first) predetermined amount from a line connecting a center of the 22nd (sixth) pillar-shaped silicon layer and a center of the 23rd (seventh) pillar-shaped silicon layer.

The semiconductor device further includes:

an 11th (first) insulating film sidewall formed on a sidewall of the 11th (first) gate line; and a silicide formed over the 12th (second) second-conductivity-type diffusion layer and the 12th (second) first-conductivity-type diffusion layer, wherein the 11th (first) predetermined amount is preferably larger than a value obtained by subtracting a length of half the width of the 11th (first) planar silicon layer from the total of the width of the 11th (first) insulating film sidewall and a length of half the width of the 11th (first) gate line.

A 11th (first) contact is formed over a portion between the 11th (first) pillar-shaped silicon layer and the 12th (second) pillar-shaped silicon layer and a portion between the 21st (fifth) pillar-shaped silicon layer and the 22nd (sixth) pillar-shaped silicon layer; and the 11th (first) gate line is preferably electrically connected to the 21st (fifth) planar silicon layer through the 11th (first) contact.

The 11th (first) predetermined amount is preferably larger than a value obtained by subtracting the total of the width of the 11th (first) insulating film sidewall and a length of half the width of the 11th (first) gate line from the width of the 11th (first) planar silicon layer.

According to the present invention, a semiconductor device having a small area occupied by an element formation region and using CMOS SGT can be provided.

Other features which are considered as characteristic for the invention are set forth in the appended claims.

Although the invention is illustrated and described herein as embodied in a semiconductor device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 1(A) is a plan view of a semiconductor device according to an embodiment of the present invention, FIG. 1(B) is a sectional view taken along line X3-X3' in FIG. 1(A), FIG. 1(C) is a sectional view taken along line Y3-Y3' in FIG. 1(A), and FIG. 1(D) is a sectional view taken along line Y4-Y4' in FIG. 1(A).

FIG. 2(A) is a plan view of a semiconductor device according to an embodiment of the present invention, FIG. 2(B) is a sectional view taken along line X1-X1' in FIG. 2(A), and FIG. 2(C) is a sectional view taken along line Y1-Y1' in FIG. 2(A).

FIG. 3(A) is a plan view of a semiconductor device according to an embodiment of the present invention, FIG. 3(B) is a sectional view taken along line X2-X2' in FIG. 3(A), and FIG. 3(C) is a sectional view taken along line Y2-Y2' in FIG. 3(A).

DETAILED DESCRIPTION OF THE INVENTION

Referring now to the figures of the drawing in detail and first, particularly, to FIG. 1 thereof, there is shown a semiconductor device according to an embodiment of the present invention that includes a first planar silicon layer 309 formed on a substrate 501, and first and second pillar-shaped silicon layers 504 and 505 formed on the first planar silicon layer 309.

The semiconductor device according to the embodiment of the present invention further includes a first gate insulating film 506 formed around the first pillar-shaped silicon layer 504, and a first gate electrode 303 formed around the first gate insulating film 506.

The semiconductor device according to the embodiment of the present invention further includes a second gate insulating film 506 formed around the second pillar-shaped silicon layer 505, a second gate electrode 304 formed around the second gate insulating film 506, a first gate line 305 connected to the first and second gate electrodes 303 and 304, a first n-type diffusion layer 524 formed in an upper portion of the first pillar-shaped silicon layer 504, a second n-type diffusion layer 502 formed over a lower portion of the first pillar-shaped silicon layer 504 and an upper portion of the planar silicon layer 309, a first p-type diffusion layer 525 formed in an upper portion of the second pillar-shaped silicon layer 505, and a second p-type diffusion layer 503 formed over a lower portion of the second pillar-shaped silicon layer 505 and an upper portion of the planar silicon layer 309.

In the semiconductor device according to the embodiment of the present invention, a center line extending along the first gate line 305, in further detail, a center line extending horizontally along the first gate line 305 and passing through the center of the first gate line 305 in the width direction thereof, is offset by a first predetermined amount from a line connecting the center of the first pillar-shaped silicon layer 504 and the center of the second pillar-shaped silicon layer 505.

Herein, an insulating film used for semiconductors, such as an oxide film, a nitride film, an oxynitride film, or a high-dielectric film, can be used as a material for the gate insulating film 506.

The semiconductor device according to the embodiment of the present invention can produce the advantages described below due to the above-described characteristics.

That is, a silicide 308 can be formed on a portion of the planar silicon layer 309 serving as an element formation region, the portion being present around a first side of the first gate line 305, thereby permitting electric connection between the second n-type diffusion layer 502 of n-type SGT and the second p-type diffusion layer 503 of p-type SGT. Therefore, the width of the planar silicon layer 309 serving as the element formation region can be narrowed as compared with a case where a silicide is formed on portions of an element formation region which are present around first and second opposing sides of a gate line.

In addition, since the planar silicon layer serving as the element formation region has a narrow width, a highly-integrated CMOS SGT inverter can be realized.

In the semiconductor device according to the embodiment of the present invention, as shown in FIG. 1, the first pillar-shaped silicon layer 504 forms n-type SGT 301, and the second pillar-shaped silicon layer 505 forms p-type SGT 302.

The semiconductor device according to the embodiment of the present invention includes a first insulating film sidewall 307 formed on the sidewall of the first gate line 305, and the silicide 308 formed over the second n-type diffusion layer 502 and the second p-type diffusion layer 503.

The first predetermined amount is larger than a value obtained by subtracting a length of half the width of the first planar silicon layer 309 from the total of the width of the first insulating film sidewall 307 and a length of half the width of the first gate line 305.

The first predetermined amount is larger than a value obtained by subtracting the total of the width of the first insulating film sidewall 307 and a length of half the width of the first gate line 305 from a length of half the width of the first planar silicon layer 309.

According to the semiconductor device according to the embodiment of the present invention, due to the above-described characteristics, a silicide can be formed on a portion of a planar silicon layer serving as an element formation region, the portion being formed around a first side of gate line.

The semiconductor device according to the embodiment of the present invention includes the first gate electrode 303 formed around the first gate insulating film 506 and having a laminated structure including a metal film 507 and polysilicon 509, and the second gate electrode 304 formed around the second gate insulating film 506 and having a laminated structure including the metal film 507 and the polysilicon 509.

A gate may be made of only a metal film or silicide. In addition, a metal used for semiconductors, such as titanium, titanium nitride, tantalum, or tantalum nitride, can be used for the metal film.

In the semiconductor device according to the embodiment of the present invention, a gate line 306 is formed to be connected to the first gate electrode 303.

The semiconductor device according to the embodiment of the present invention includes a second insulating film sidewall including an oxide film 516 and a nitride film 517 and formed over an upper sidewall of the first pillar-shaped silicon layer 504 and an upper portion of the first gate electrode 303, a third insulating film sidewall including an oxide film 518 and a nitride film 519 and formed over an upper sidewall of the second pillar-shaped silicon layer 505 and an upper portion of the second gate electrode 304, the first insulating film sidewall 307 formed over the second and third insulating film sidewalls, the first and second gate electrodes 303 and 304, and the sidewalls of the first gate line 305 and the gate line 306, and silicides 511 and 513 formed over the first n-type diffusion layer 524 and the first p-type diffusion layer 525.

In the semiconductor device according to the embodiment of the present invention, an upper portion of the second gate electrode 304 is covered with the third insulating film sidewall 518, 519, and the sidewall is covered with the first insulating film sidewall 307. The sidewall of the third insulating film sidewall 518, 519 is covered with the first insulating sidewall 307. Therefore, when a contact 523 formed on a diffusion layer in an upper portion of the planar silicon layer 309 is offset to the second gate electrode 304, short-circuiting between the second gate electrode 304 and the contact 523 can be prevented.

Further, a silicide 510 is formed on the gate line 306, and a silicide 512 is formed on the first gate line 305. In addition, a silicide 514 is formed on the second p-type diffusion layer 503. Further, a contact 520, a contact 521, a contact 522, and a contact 523 are formed on the silicide 510, the silicide 511, the silicide 513, and the silicide 514, respectively.

Further, an element separation film 508 is formed around the first planar silicon layer 309, and interlayer insulating film 515 is formed around each of the n-type SGT 301 and the p-type SGT 302.

Next, FIGS. 2 and 3 show a structure in which the semiconductor device according to the embodiment is applied to SRAM.

As shown in FIGS. 2 and 3, the semiconductor device according to the embodiment includes, in the first row of coordinates of rows and columns arranged on a substrate 201, an 11th (first) planar silicon layer 121 extending in the row direction, an 11th (first) pillar-shaped silicon layer 208 formed on the 11th (first) planar silicon layer 121 to be disposed in the first row and the first column of the coordinates on the substrate 201, an 11th (first) gate insulating film 215 formed around the 11th (first) pillar-shaped silicon layer 208, and an 11th (first) gate electrode 107 formed around the 11th (first) gate insulating film 215.

The semiconductor device according to the embodiment further includes n-type SGT 101 including an 11th (first) n-type diffusion layer 227 formed in an upper portion of the 11th (first) pillar-shaped silicon layer 208 and a 12th (second) n-type diffusion layer 202 formed over a lower portion of the 11th (first) pillar-shaped silicon layer 208 and an upper portion of the 11th (first) planar silicon layer 121, a 12th (second) pillar-shaped silicon layer 209 formed on the 11th (first) planar silicon layer 121 to be disposed in the first row and the second column of the coordinate on the substrate 201, a 12th (second) gate insulating film 215 formed around the 12th (second) pillar-shaped silicon layer 209, and a 12th (second) gate electrode 108 formed around the 12th (second) gate insulating film 215.

The semiconductor device according to the embodiment further includes p-type SGT 102 including an 11th (first) p-type diffusion layer 228 formed in an upper portion of the 12th (second) pillar-shaped silicon layer 209 and a 12th (second) p-type diffusion layer 203 formed over a lower portion of the 12th (second) pillar-shaped silicon layer 209 and an upper portion of the 11th (first) planar silicon layer 121, a 13th (third) pillar-shaped silicon layer 210 formed on the 11th (first) planar silicon layer 121 to be disposed in the first row and the third column of the coordinates on the substrate 201, a 13th (third) gate insulating film 217 formed around the 13th (third) pillar-shaped silicon layer 210, and a 13th (third) gate electrode 109 formed around the 13th (third) gate insulating film 217.

The semiconductor device according to the embodiment further includes n-type SGT 103 including a 13th (third) n-type diffusion layer 229 formed in an upper portion of the 13th (third) pillar-shaped silicon layer 210 and a 14th (fourth) n-type diffusion layer 204 formed over a lower portion of the 13th (third) pillar-shaped silicon layer 210 and an upper portion of the 11th (first) planar silicon layer 121, and an 11th (first) gate line 113 connected to the 11th (first) and 12th (second) gate electrodes 107 and 108.

The semiconductor device according to the embodiment further includes, in the second row of the coordinates on the substrate 201, a 21st (fifth) planar silicon layer 122 extending in the row direction, a 21st (fifth) pillar-shaped silicon layer 211 formed on the 21st (fifth) planar silicon layer 122 to be disposed in the second row and the first column of the coordinates on the substrate 201, a 21st (fifth) gate insulating film 219 formed around the 21st (fifth) pillar-shaped silicon layer 211, and a 21st (fifth) gate electrode 110 formed around the 21st (fifth) gate insulating film 219.

The semiconductor device according to the embodiment further includes n-type SGT 104 including a 21st (fifth) n-type diffusion layer 230 formed in an upper portion of the 21st (fifth) pillar-shaped silicon layer 211 and a 22nd (sixth) n-type diffusion layer 205 formed over a lower portion of the 21st (fifth) pillar-shaped silicon layer 211 and an upper portion of the 21st (fifth) planar silicon layer 122, a 22nd (sixth) pillar-shaped silicon layer 212 formed on the 21st (fifth) planar silicon layer 122 to be disposed in the second row and the second column of the coordinates, a 22nd (sixth) gate insulating film 221 formed around the 22nd (sixth) pillar-shaped silicon layer 212, and a 22nd (sixth) gate electrode 111 formed around the 22nd (sixth) gate insulating film 221.

The semiconductor device according to the embodiment further includes p-type SGT 105 including a 21st (fifth) p-type diffusion layer 231 formed in an upper portion of the 22nd (sixth) pillar-shaped silicon layer 212 and a 22nd (sixth) p-type diffusion layer 206 formed over a lower portion of the 22nd (sixth) pillar-shaped silicon layer 212 and an upper portion of the 21st (fifth) planar silicon layer 122, a 23rd (seventh) pillar-shaped silicon layer 213 formed on the 21st (fifth) planar silicon layer 122 to be disposed in the second row and the third column of the coordinates, a 23rd (seventh) gate insulating film 221 formed around the 23rd (seventh) pillar-shaped silicon layer 213, and a 23rd (seventh) gate electrode 112 formed around the 23rd (seventh) gate insulating film 221.

The semiconductor device according to the embodiment further includes n-type SGT 106 including a 23rd (seventh) n-type diffusion layer 232 formed in an upper portion of the 23rd (seventh) pillar-shaped silicon layer 213 and a 24th (eighth) n-type diffusion layer 207 formed over a lower portion of the 23rd (seventh) pillar-shaped silicon layer 213 and an upper portion of the 21st (fifth) planar silicon layer 122, and a 21st (fifth) gate line 116 connected to the 22nd (sixth) and 23rd (seventh) gate electrodes 111 and 112.

In the semiconductor device according to the embodiment of the present invention, a center line C1 extending along the 11th (first) gate line 113 is offset by an 11th (first) predetermined amount A from a line connecting the center of the 11th (first) pillar-shaped silicon layer 208 and the center of the 12th (second) pillar-shaped silicon layer 209 to the second row of the coordinates on the substrate 201.

Also in the semiconductor device according to the embodiment of the present invention, a center line C3 extending along the 21st (fifth) gate line 116 is offset by the 11th (first) predetermined amount A from a line C4 connecting the center of the 22nd (sixth) pillar-shaped silicon layer 212 and the center of the 23rd (seventh) pillar-shaped silicon layer 213 to the first row of the coordinates on the substrate 201.

The semiconductor device according to the embodiment further includes an 11th (first) insulating film sidewall 127 formed on the sidewall of the 11th (first) gate line 113, and a silicide 117 formed on the 12th (second) n-type diffusion layer 202 and the 12th (second) p-type diffusion layer 203. The 11th (first) predetermined amount is larger than a value obtained by subtracting a length of half the width W1 of the 11th (first) planar silicon layer 121 from the total of the width W2 of the 11th (first) insulating film sidewall 127 and a length of half the width W3 of the 11th (first) gate line 113.

In the embodiment, an 11th (first) contact 124 is formed over a portion between the 11th (first) pillar-shaped silicon layer 208 and the 12th (second) pillar-shaped silicon layer 209 and a portion between the 21st (fifth) pillar-shaped silicon layer 211 and the 22nd (sixth) pillar-shaped silicon layer 212. The 11th (first) contact 124 electrically connects the 11th (first) gate line 113 and the 21st (fifth) planar silicon layer 122.

Also in the embodiment, the 11th (first) predetermined amount is larger than a value obtained by subtracting the total of the width W2 of the 11th (first) insulating film sidewall 127 and a length of half the width W3 of the 11th (first) gate line 113 from a length of half the width W1 of the 11th (first) planar silicon layer 121.

In the embodiment, a silicide is formed on a portion of the 11th (first) planar silicon layer 121 serving as an element formation region, the portion being present around a first side of the 11th (first) gate line 113, thereby permitting electric connection between the 12th (second) n-type diffusion layer 202 of the n-type SGT 101 and the 12th (second) p-type diffusion layer 203 of the p-type SGT 102.

The embodiment has a structure in which a portion of the 11th (first) planar silicon layer 121 serving as an element formation region, the portion being present around a second side of the 11th (first) gate line 113, is covered with the 11th (first) gate line 113 and the 11th (first) insulating film sidewall 127.

Therefore, according to the embodiment, the 11th (first) contact 124 is formed over a portion between the 11th (first) pillar-shaped silicon layer 208 and the 12th (second) pillar-shaped silicon layer 209 and a portion between the 21st (fifth) pillar-shaped silicon layer 211 and the 22nd (sixth) pillar-shaped silicon layer 212, thereby permitting the 11th (first) gate line 113 and the 21st (fifth) planar silicon layer 122 to be electrically connected to each other through the 11th (first) contact 124 and the 11th (first) planar silicon layer 121 and the 11th (first) contact 124 to be insulated from each other.

According to the embodiment, input and output of a SRAM inverter can be electrically connected to each other through the 11th (first) contact 124. As a result, a highly integrated SRAM can be provided.

In the embodiment, an insulating film used for semiconductors, such as an oxide film, a nitride film, an oxynitride film, or a high-dielectric film, can be used for the gate insulating film 221.

The semiconductor device according to the embodiment of the present invention further includes the 11th (first) gate electrode 107 formed around the 11th (first) gate insulating film 215 and having a laminated structure including a metal film 216 and polysilicon 223, the 12th (second) gate electrode 108 formed around the 12th (second) gate insulating film 215 and having a laminated structure including the metal film 216 and the polysilicon 223, and the 13th (third) gate electrode 109 formed around the 13th (third) gate insulating film 217 and having a laminated structure including a metal film 218 and polysilicon 224. The gate may be made of only a metal film. Alternatively, a silicide may be used as a material of the gate. In addition, a metal used for semiconductors, such as titanium, titanium nitride, tantalum, or tantalum nitride, can be used for the metal film.

A gate line 114 is formed to be connected to the 13th (third) gate electrode 109.

The semiconductor device according to the embodiment of the present invention further includes an insulating film sidewall including an oxide film 244 and a nitride film 245 and formed over an upper sidewall of the 11th (first) pillar-shaped silicon layer 208 and an upper portion of the 11th (first) gate electrode 107, an insulating film sidewall including an oxide film 246 and a nitride film 247 and formed over an upper sidewall of the 12th (second) pillar-shaped silicon layer 209 and an upper portion of the 12th (second) gate electrode 108, an insulating film sidewall including an oxide film 248 and a nitride film 249 and formed over an upper sidewall of the 13th (third) pillar-shaped silicon layer 210 and an upper portion of the 13th (third) gate electrode 109, and silicides 234, 236, and 237 formed over the 11th (first) n-type diffusion layer 227, the 11th (first) p-type diffusion layer 228, and the 13th (third) n-type diffusion layer 229.

A silicide 118 is formed over the 12th (second) n-type diffusion layer 203 and the 14th (fourth) (fourth) n-type diffusion layer 204, and a silicide 235 is formed on the 11th (first) gate line 113. In addition, a silicide 238 is formed on the gate line 114.

An insulating film sidewall 128 is formed on the sidewall of the gate line 114.

Further, a contact 257, a contact 258, and a contact 259 are formed on the silicide 234, the silicide 236, and the silicide 237, respectively.

The semiconductor device according to the embodiment of the present invention further includes the 21st (fifth) gate electrode 110 formed around the 21st (fifth) gate insulating film 219 and having a laminated structure including a metal film 220 and polysilicon 225, the 22nd (sixth) gate electrode 111 formed around the 22nd (sixth) gate insulating film 221 and having a laminated structure including a metal film 222 and polysilicon 226, and the 23rd (seventh) gate electrode 112 formed around the 23rd (seventh) gate insulating film 221 and having a laminated structure including the metal film 222 and the polysilicon 226.

The gate may be made of only a metal film. Alternatively, a silicide may be used for the gate. In addition, a metal used for semiconductors, such as titanium, titanium nitride, tantalum, or tantalum nitride, can be used for the metal film.

Also in the embodiment, a gate line 115 is formed to be connected to the 21st (fifth) gate electrode 110.

The semiconductor device according to the embodiment of the present invention further includes an insulating film sidewall including an oxide film 250 and a nitride film 251 and formed over an upper sidewall of the 21st (fifth) pillar-shaped silicon layer 211 and an upper portion of the 21st (fifth) gate electrode 110, an insulating film sidewall including an oxide film 252 and a nitride film 253 and formed over an upper sidewall of the 22nd (sixth) pillar-shaped silicon layer 212 and an upper portion of the 22nd (sixth) gate electrode 111, an insulating film sidewall including an oxide film 254 and a nitride film 255 and formed over an upper sidewall of the 23rd (seventh) pillar-shaped silicon layer 213 and an upper portion of the 23rd (seventh) gate electrode 112, and silicides 240, 241, and 243 formed on the 21st (fifth) n-type diffusion layer 230, the 21st (fifth) p-type diffusion layer 231, and the 23rd (seventh) n-type diffusion layer 232.

In the embodiment, a silicide 119 is formed over the 22nd (sixth) n-type diffusion layer 205 and the 22nd (sixth) p-type diffusion layer 206, and a silicide 242 is formed on the 21st (fifth) gate line 116. In addition, a silicide 239 is formed on the gate line 115.

A silicide 120 is formed over the 22nd (sixth) p-type diffusion layer 206 and the 24th (eighth) n-type diffusion layer 207.

An insulating film sidewall 129 is formed on the sidewall of the gate line 115. An insulating film sidewall 130 is formed on the sidewall of the 21st (fifth) gate line 116.

Further, a contact 260, a contact 261, and a contact 262 are formed on the silicide 240, the silicide 241, and the silicide 243, respectively.

Further, a contact 123, an 11th (first) contact 124, a contact 125, and a contact 126 are formed on the silicide 239, the silicides 235 and 119, the silicide 118 and 242, and the silicide 238, respectively.

An element separation region 214 is formed around the 11th (first) planar silicon layer 121 and the 21st (fifth) planar silicon layer 122. In addition, an interlayer insulating film 256 is formed around the n-type SGTs 101, 103, 104, and 106, and the p-type SGTs 102 and 104.

According to the embodiment, the above-described configuration permits electric connection between input and output of a SRAM inverter through the 11th (first) contact 124, and thus highly integrated SRAM can be provided.

In the above-described embodiment of the present invention, the center line extending along the first gate line is offset by the first predetermined amount from the line connecting the center of the first pillar-shaped silicon layer and the second pillar-shaped silicon layer.

Therefore, the second n-type diffusion layer of n-type SGT and the second p-type diffusion layer of p-type SGT can be electrically connected to each other by forming a silicide on a portion of the planar silicon layer serving as the element formation region, the portion being formed around a first side of the gate line. As a result, the width of the planar silicon layer serving as the element formation region can be narrowed as compared with when a silicide is formed on portions of an element formation region around both opposing sides of gate line. Since the planar silicon layer serving as the element formation region has a narrow width, a highly integrated CMOS SGT inverter can be realized.

According to the embodiment of the present invention, the first insulating film sidewall is formed on the sidewall of the first gate line, and the silicide is formed over the second n-type diffusion layer and the second p-type diffusion layer. Further, the first predetermined amount is larger than a value obtained by subtracting a length of half the width of the first planar silicon layer from the total of the width of the first insulating film sidewall and a length of half the width of the first gate line. Thus, a silicide can be formed on a portion of the planar silicon layer serving as the element formation region, the portion being present around a first side of gate line.

According to the embodiment of the present invention, an upper portion of the second gate electrode is covered with the third insulating film sidewall, and the sidewall is covered with the first insulating film sidewall. The sidewall of the third insulating film sidewall is covered with the first insulating film sidewall. Therefore, when the contact formed on the diffusion layer in an upper portion of the planar silicon layer is offset to the second gate electrode side (relative position is shifted), short-circuiting between the second gate electrode and the contact can be prevented.

According to the embodiment of the present invention, a CMOS SGT structure having a narrow planar silicon layer serving as an element formation region can be provided. This can provide highly-integrated SRAM.

According to the embodiment of the present invention, the 12th (second) n-type diffusion layer of n-type SGT and the 12th (second) p-type diffusion layer of p-type SGT can be electrically connected to each other by forming a silicide in a portion of the 11th (first) planar silicon layer serving as the element formation region, the portion being present around a first side of the 11th (first) gate line. Also, a portion of the 11th (first) planar silicon layer serving as the element formation region, the portion being present around a second side of the 11th (first) gate line, is covered with the 11th (first) gate line and the 11th (first) insulating film sidewall. Therefore, the 11th (first) contact is formed over a portion between the 11th (first) pillar-shaped silicon layer and the 12th (second) pillar-shaped silicon layer and a portion between the 21st (fifth) pillar-shaped silicon layer and the 22nd (sixth) pillar-shaped silicon layer, thereby permitting electric connection between the 11th (first) gate line and the 21st (fifth) planar silicon layer through the 11th (first) contact and insulation of the 11th (first) planar silicon layer from the 11th (first) contact.

According to the embodiment of the present invention, input and output of a SRAM inverter can be electrically connected through the 11th (first) contact. Therefore, highly-integrated SRAM can be provided.

In the present invention, various embodiments and modifications can be made without deviating from the broad spirit and scope of the present invention. The above-described embodiments are illustrative of an example of the present invention and do not limit the scope of the present invention.

For example, the technical scope of the present invention, of course, includes a method for manufacturing a semiconductor device in which conductivity types are reversed from the p-type (including p+-type) and the n-type (n+-type) in the above-described embodiments, and a semiconductor device manufactured by the method.

The invention claimed is:
1. A semiconductor device, comprising:
a first planar silicon layer in a first row of coordinates of rows and columns on a substrate extending in a row direction;
a first pillar-shaped silicon layer on the first planar silicon layer in the first row and a first column of the coordinates;
a first portion of a gate insulating film around the first pillar-shaped silicon layer;
a first portion of a agate electrode around the first portion of the gate insulating film;
a first second-conductivity-type diffusion layer in an upper portion of the first pillar-shaped silicon layer;
a second second-conductivity-type diffusion layer over a lower portion of the first pillar-shaped silicon layer and an upper portion of the first planar silicon layer;

a second pillar-shaped silicon layer on the first planar silicon layer in the first row and the second column of the coordinates;
a second portion of the gate insulating film around the second pillar-shaped silicon layer;
a second portion of the gate electrode around the second gate insulating film;
a first first-conductivity-type diffusion layer in an upper portion of the second pillar-shaped silicon layer;
a second first-conductivity-type diffusion layer over a lower portion of the second pillar-shaped silicon layer and an upper portion of the first planar silicon layer;
a third pillar-shaped silicon layer on the first planar silicon layer in the first row and the third column of the coordinates;
a third gate insulating film around the third pillar-shaped silicon layer;
a third gate electrode around the third gate insulating film;
a third second-conductivity-type diffusion layer in an upper portion of the third pillar-shaped silicon layer;
a fourth second-conductivity-type diffusion layer over a lower portion of the third pillar-shaped silicon layer and an upper portion of the first planar silicon layer;
a first gate line connected to the first and second gate electrodes;
a fifth planar silicon layer in the a second row of the coordinates on the substrate;
a fifth pillar-shaped silicon layer on the fifth planar silicon layer in the second row and the first column of the coordinates;
a first portion of a fifth gate insulating film around the fifth pillar-shaped silicon layer;
a first portion of a fifth gate electrode around the fifth gate insulating film;
a fifth second-conductivity-type diffusion layer in an upper portion of the fifth pillar-shaped silicon layer;
a sixth second-conductivity-type diffusion layer over a lower portion of the fifth pillar-shaped silicon layer and an upper portion of the fifth planar silicon layer;
a sixth pillar-shaped silicon layer on the fifth planar silicon layer in the second row and the second column of the coordinates;
a second portion of the fifth gate insulating film around the sixth pillar-shaped silicon layer;
a second portion of fifth gate electrode around the sixth gate insulating film;
a fifth first-conductivity-type diffusion layer in an upper portion of the sixth pillar-shaped silicon layer;
a sixth first-conductivity-type diffusion layer over a lower portion of the sixth pillar-shaped silicon layer and an upper portion of the fifth planar silicon layer;
a seventh pillar-shaped silicon layer on the fifth planar silicon layer in the second row and the third column of the coordinates;
a seventh gate insulating film around the seventh pillar-shaped silicon layer;
a seventh gate electrode around the seventh gate insulating film;
a seventh second-conductivity-type diffusion layer in an upper portion of the seventh pillar-shaped silicon layer;
an eighth second-conductivity-type diffusion layer over a lower portion of the seventh pillar-shaped silicon layer and an upper portion of the fifth planar silicon layer; and
a fifth gate line connected to the sixth and seventh gate electrodes, wherein a center line extending along the first gate line is offset toward the second row of the coordinates by a first predetermined amount from a line connecting a center of the first pillar-shaped silicon layer and a center of the second pillar-shaped silicon layer to expose a first offset region;
a first silicide connection residing in the first offset region;
a center line extending along the fifth gate line is offset toward the first row of the coordinates by a second predetermined amount from a line which connects a center of the sixth pillar-shaped silicon layer and a center of the seventh pillar-shaped silicon layer to expose a second offset region, the first predetermined amount equaling the second predetermined amount; and
a second silicide connection residing in the second offset region.

2. The semiconductor device according to claim 1, further comprising:
a first insulating film sidewall on a sidewall of the first gate line; and
the first silicide connection over the second second-conductivity-type diffusion layer and the second first-conductivity-type diffusion layer,
wherein the first predetermined amount is larger than a value obtained by subtracting a length of half a width of the first planar silicon layer from a total of the a width of the first insulating film sidewall and a length of half a width of the first gate line.

3. The semiconductor device according to claim 2, wherein a first contact is over a portion between the first pillar-shaped silicon layer and the second pillar-shaped silicon layer and a portion between the fifth pillar-shaped silicon layer and the sixth pillar-shaped silicon layer, and
the first gate line is electrically connected to the fifth planar silicon layer through the first contact.

4. The semiconductor device according to claim 1, wherein the first predetermined amount is greater than a value obtained by subtracting a total of a width of the first insulating film sidewall and a length of half a width of the first gate line from half a width of the first planar silicon layer.

* * * * *

UNITED STATES PATENT AND TRADEMARK OFFICE
CERTIFICATE OF CORRECTION

PATENT NO. : 9,853,113 B2
APPLICATION NO. : 14/602727
DATED : December 26, 2017
INVENTOR(S) : Fujio Masuoka et al.

Page 1 of 1

It is certified that error appears in the above-identified patent and that said Letters Patent is hereby corrected as shown below:

In the Claims

In Column 12, Claim 1, Line 61, after "first portion of" replace "a agate" with --a gate--.

Signed and Sealed this
Tenth Day of April, 2018

Andrei Iancu
*Director of the United States Patent and Trademark Office*